United States Patent

Kimura et al.

[11] Patent Number: 5,963,787
[45] Date of Patent: Oct. 5, 1999

[54] METHOD OF PRODUCING GALLIUM NITRIDE SEMICONDUCTOR LIGHT EMITTING DEVICE

[75] Inventors: Akitaka Kimura; Chiaki Sasaoka, both of Tokyo, Japan

[73] Assignee: NEC Corporation, Tokyo, Japan

[21] Appl. No.: 09/115,176

[22] Filed: Jul. 14, 1998

[30] Foreign Application Priority Data

Jul. 15, 1997 [JP] Japan .................................... 9-189886

[51] Int. Cl.⁶ ............................................. H01L 21/203
[52] U.S. Cl. .................. 438/46; 438/38; 438/45; 427/255.7
[58] Field of Search ............... 427/248.1, 255.7, 427/78; 438/46, 38, 45

[56] References Cited

U.S. PATENT DOCUMENTS

| 5,739,554 | 4/1998 | Edmond et al. | 257/103 |
| 5,751,752 | 5/1998 | Shakouda | 372/45 |
| 5,767,581 | 6/1998 | Nakamura et al. | 257/749 |
| 5,793,054 | 8/1998 | Nido | 257/18 |
| 5,814,533 | 9/1998 | Shakuda | 438/46 |

FOREIGN PATENT DOCUMENTS 8-8460   1/1996   Japan .

*Primary Examiner*—Roy V. King
*Attorney, Agent, or Firm*—McGinn & Gibb, P.C.

[57] ABSTRACT

A magnesium-doped semiconductor layer expressed by general formula $Al_xGa_{1-x}N$ (where $0 \leq x \leq 1$) is formed on a substrate. Thereafter, on the semiconductor layer, a plurality of semiconductor layers (including an activation layer) expressed by general formula $In_xAl_yGa_{1-x-y}N$ (where $0 \leq x \leq 1$, $0 \leq y \leq 1$, $0 \leq x+y \leq 1$) are formed. The crystalline characteristics of semiconductor layers including a light emitting layer of a gallium nitride semiconductor light emitting device having a magnesium-doped gallium nitride semiconductor layer are good. Thus, in the case that the light emitting device is a laser device, it can be expected that the oscillating threshold value of the laser device becomes low. In the case that the light emitting device is a light emitting diode, it can be expected that the light emitting efficiency of the light emitting diode becomes high.

5 Claims, 3 Drawing Sheets

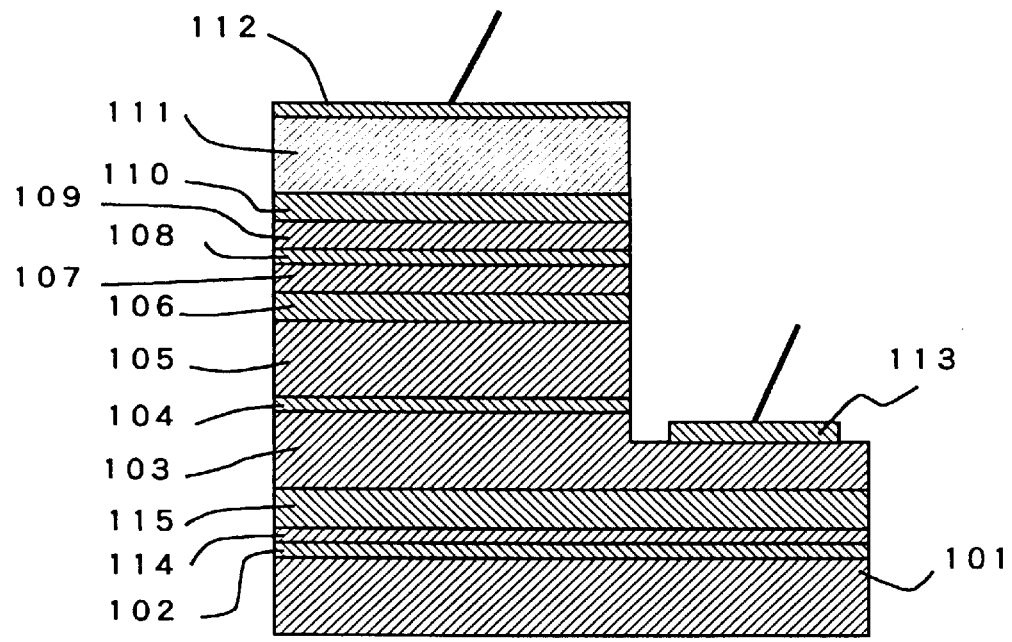
F I G . 1

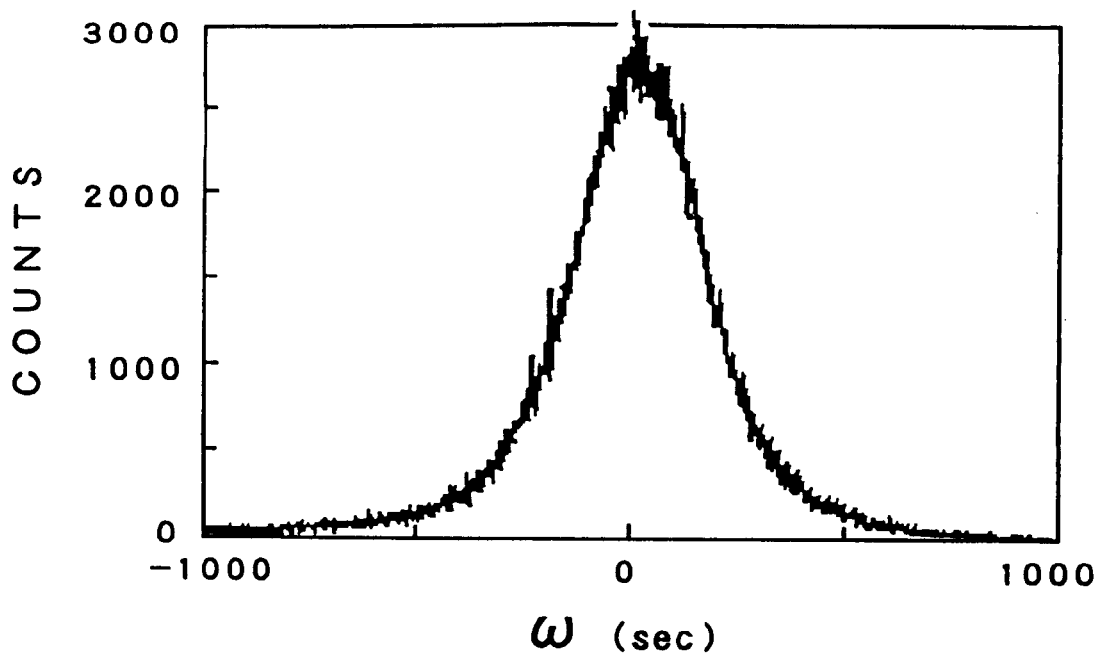
F I G. 3
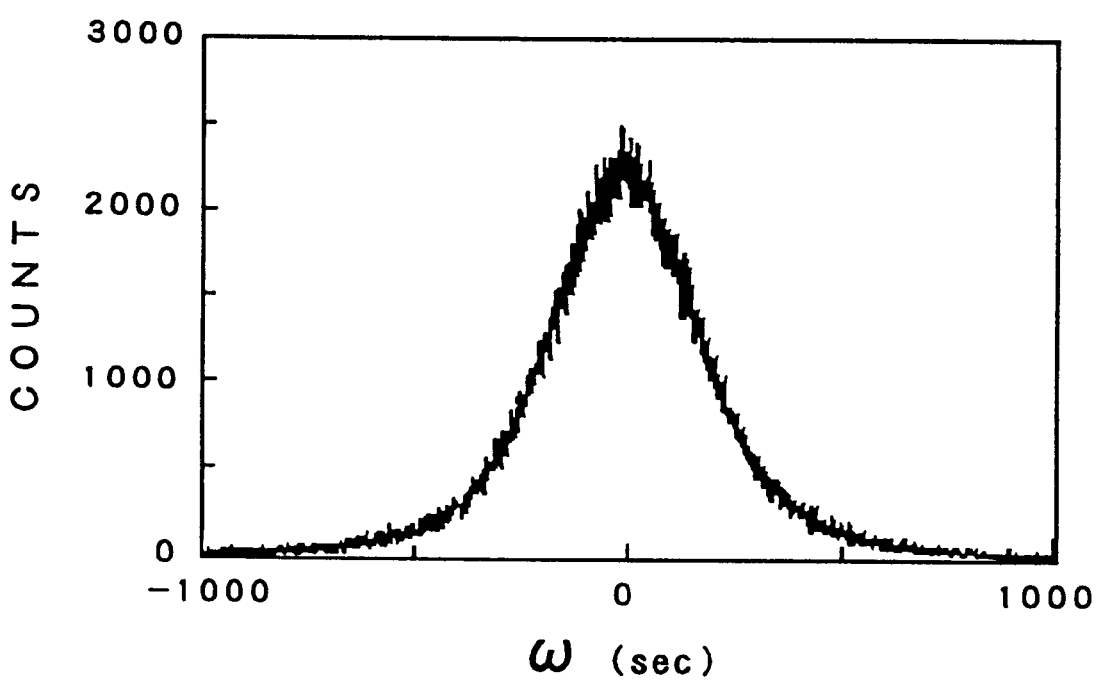
F I G. 4

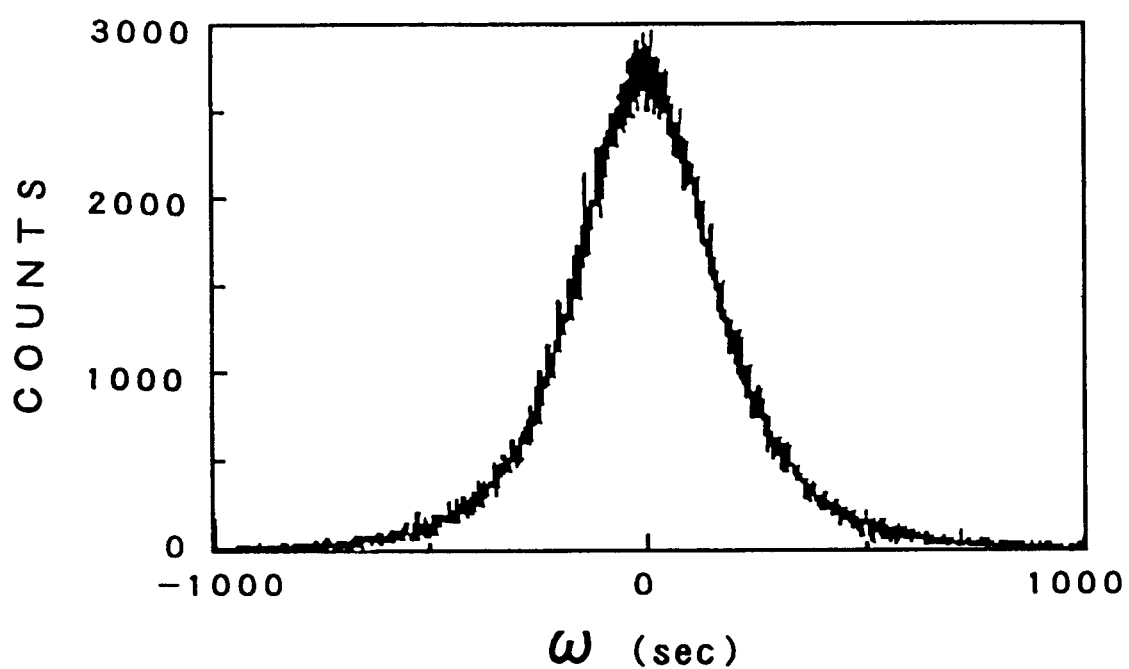
F I G. 5

METHOD OF PRODUCING GALLIUM NITRIDE SEMICONDUCTOR LIGHT EMITTING DEVICE

BACKGROUND OF THE INVENTION

1. Field of the Invention

The present invention relates to a method of producing such a gallium nitride semiconductor light emitting device.

2. Description of the Related Art

Gallium nitride has higher forbidden band energy than conventional compound semiconductors such as indium phosphide and gallium arsenide. Thus, it is expected that a semiconductor expressed by general formula $In_xAl_yGa_{1-x-y}N$ ($0 \leq x \leq 1$, $0 \leq y \leq 1$, $0 \leq x+y \leq 1$) (hereinafter referred to as gallium nitride semiconductor) will be applied to a light emitting device which emits light with a wavelength from green to ultra violet, in particular, to a semiconductor laser device (hereinafter simply referred to as laser device).

In a conventional crystal-growing process for a gallium nitride semiconductor, after an undoped gallium nitride layer or a silicon-doped n-type gallium nitride layer is formed on a substrate, at least one gallium nitride semiconductor layer is formed on the semiconductor layer (by S. Nakamura et al, "Extended Abstracts of 1996 International Conference on Solid State Devices and Materials, Yokohama, 1996, pp. 67–69).

FIG. 2 is a sectional view showing an outlined structure of a gallium nitride laser device composed of a semiconductor layer formed by such a conventional crystal growing method.

In FIG. 2, the gallium nitride laser device is fabricated by forming on a (11-20) surface of a sapphire substrate 101 a 300 angstrom thick undoped gallium nitride low temperature growing buffer layer 102, a 3 $\mu$m thick silicon-doped n-type gallium nitride contact layer 103, a 0.1 $\mu$m thick silicon-doped n-type $In_{0.05}Ga_{0.095}N$ crack protecting layer 104, a 0.4 $\mu$m thick n-type $Al_{0.07}Ga_{0.93}N$ clad layer 105, a 0.1 $\mu$m thick silicon-doped n-type gallium nitride optical guide layer 106, a seventh period multiple quantum well structural activation layer 107 (composed of a 25 angstrom thick undoped $In_{0.2}Ga_{0.8}N$ quantum well layer and a 50 angstrom thick undoped $In_{0.05}Ga_{0.95}N$ barrier layer), a 200 angstrom thick magnesium-doped p-type $Al_{0.2}Ga_{0.8}N$ indium dissociation protecting layer 108, a 0.1 $\mu$m thick magnesium-doped p-type gallium nitride optical guide layer 109, a 0.4 $\mu$m thick magnesium-doped p-type $Al_{0.07}Ga_{0.93}N$ clad layer 110, a 0.2 $\mu$m thick magnesium-doped p-type gallium nitride contact layer 111, a p-type electrode 112 (composed of nickel (first layer) and gold (second layer)), and an n-type electrode 113 (composed of titanium (first layer) and aluminum (second layer)).

In the gallium nitride laser device composed of semiconductor layers formed by the conventional crystal growing method shown in FIG. 2, the silicon-doped n-type gallium nitride layer is formed on the gallium nitride low temperature buffer layer 102. Generally, the crystalline characteristics of the silicon-doped $Al_xGa_{1-x}N$ (where $0 \leq x \leq 1$) layer are inferior to the crystalline characteristics of the undoped $Al_xGa_{1-x}N$ (where $0 \leq x \leq 1$) layer or the magnesium-doped $Al_xGa_{1-x}N$ ($0 \leq x \leq 1$) layer in half width at half maximum (FWHM) on a rocking curve in a two-crystal X-ray diffraction evaluation. Thus, the crystalline characteristics of each layer including the multiple quantum well activation layer 107 formed on the silicon-doped $Al_xGa_{1-x}N$ (where $0 \leq x \leq 1$) layer deteriorate.

SUMMARY OF THE INVENTION

An object of the present invention is to provide a crystal growing method for forming a gallium nitride semiconductor, in particular, to a crystal growing method for forming a good crystal so as to accomplish a gallium nitride light emitting device having semiconductor layers with good crystalline characteristics.

A first aspect of the present invention is a method of producing a gallium nitride semiconductor light emitting device, comprising the steps of (a) forming an undoped gallium nitride low temperature growing buffer layer 102 on a substrate 101, (b) forming a magnesium-doped gallium nitride layer 115 expressed by general formula $Al_xGa_{1-x}N$ (where $0 \leq x \leq 1$), (c) forming a contact layer 103 expressed by general formula $In_xAl_yGa_{1-x-y}N$ (where $0 \leq x \leq 1$, $0 \leq y \leq 1$, $0 \leq x+y \leq 1$), (d) forming a clad layer 105 expressed by general formula $In_xAl_yGa_{1-x-y}N$ (where $0 \leq x \leq 1$, $0 \leq y \leq 1$, $0 \leq x+y \leq 1$), (e) forming an optical guide layer 106 expressed by general formula $In_xAl_yGa_{1-x-y}N$ (where $0 \leq x \leq 1$, $0 \leq y \leq 1$, $0 \leq x+y \leq 1$), (f) forming an activation layer 107, (g) forming a magnesium-doped p-type gallium nitride optical guide layer 109, (h) forming a clad layer 110 expressed by general formula $In_xAl_yGa_{1-x-y}N$ (where $0 \leq x \leq 1$, $0 \leq y \leq 1$, $0 \leq x+y \leq 1$), (i) forming a contact layer 111 expressed by general formula $In_xAl_yGa_{1-x-y}N$ (where $0 \leq x \leq 1$, $0 \leq y \leq 1$, $0 \leq x+y \leq 1$), and (j) forming an electrode 112.

Each step can be performed in the order corresponding to a desired structure of a gallium nitride semiconductor light emitting device to be fabricated.

According to the present invention, before the gallium nitride layer is formed, an undoped gallium nitride 114 may be formed.

In summary, in the method of producing the gallium nitride semiconductor device according to the present invention, after a magnesium-doped semiconductor layer expressed by general formula $Al_xGa_{1-x}N$ (where $0 \leq x \leq 1$) is formed on a substrate, a plurality of semiconductor layers (including an activation layer) expressed by general formula $In_xAl_yGa_{1-x-y}N$ (where $0 \leq x \leq 1$, $0 \leq y \leq 1$, $0 \leq x+y \leq 1$) are formed thereon.

Thus, by the method of the gallium nitride semiconductor light emitting device according to the present invention, a gallium nitride semiconductor with higher quality than that by the conventional fabrication method can be accomplished. Consequently, the crystalline characteristics of the semiconductor layers including a light emitting layer are improved. As a result, in the case that the light emitting device according to the present invention is a laser device, it can be expected that the oscillating threshold value of the laser device becomes low. On the other hand, in the case that the light emitting device according to the present invention is a light emitting diode, it can be expected that the light emitting efficiency of the light emitting diode becomes high.

In addition, according to the present invention, a gallium nitride semiconductor light emitting device composed of a magnesium-doped semiconductor layer expressed by general formula $Al_xGa_{1-x}N$ (where $0 \leq x \leq 1$) and a plurality of semiconductor layers (including an activation layer) expressed by general formula $In_xAl_yGa_{1-x-y}N$ (where $0 \leq x \leq 1$, $0 \leq y \leq 1$, $0 \leq x+y \leq 1$) formed on a substrate by a crystal-growing method is provided.

A second aspect of the present invention is a gallium nitride semiconductor light emitting device, comprising a substrate 101, an undoped gallium nitride low temperature growing buffer layer 102 formed on the substrate 101, a magnesium-doped gallium nitride layer 115 expressed by general formula $Al_xGa_{1-x}N$ (where $0 \leq x \leq 1$), a contact layer 103 expressed by general formula $In_xAl_yGa_{1-x-y}N$ (where $0 \leq x \leq 1, 0 \leq y \leq 1, 0 \leq x+y \leq 1$), a clad layer 105 expressed by general formula $In_xAl_yGa_{1-x-y}N$ (where $0 \leq x \leq 1, 0 \leq y \leq 1, 0 \leq x+y \leq 1$), an optical guide layer 106 expressed by general formula $In_xAl_yGa_{1-x-y}N$ (where $0 \leq x \leq 1, 0 \leq y \leq 1, 0 \leq x+y \leq 1$), an activation layer 107, a magnesium-doped p-type gallium nitride optical guide layer 109, a clad layer 110 expressed by general formula $In_xAl_yGa_{1-x-y}N$ (where $0 \leq x \leq 1, 0 \leq y \leq 1, 0 \leq x+y \leq 1$), a contact layer 111 expressed by general formula $In_xAl_yGa_{1-x-y}N$ (where $0 \leq x \leq 1, 0 \leq y \leq 1, 0 \leq x+y \leq 1$), and an electrode 112.

These and other objects, features and advantages of the present invention will become more apparent in light of the following detailed description of a best mode embodiment thereof, as illustrated in the accompanying drawings.

BRIEF DESCRIPTION OF THE DRAWINGS

FIG. 1 is a sectional view showing an outlined structure of a gallium nitride laser device fabricated by a crystal growing method according to the present invention;

FIG. 3 is a graph showing an X-ray rocking curve of a Mg-doped p-GaN layer specimen formed on a sapphire substrate;

FIG. 4 is a graph showing an X-ray rocking curve of an undoped GaN layer specimen formed on sapphire substrate; and FIG. 5 is a graph showing an X-ray rocking curve of a specimen of which an Mg-doped p-GaN layer and a Si-doped n-GaN layer are successively formed on a sapphire substrate.

DESCRIPTION OF PREFERRED EMBODIMENTS

Figure 2:
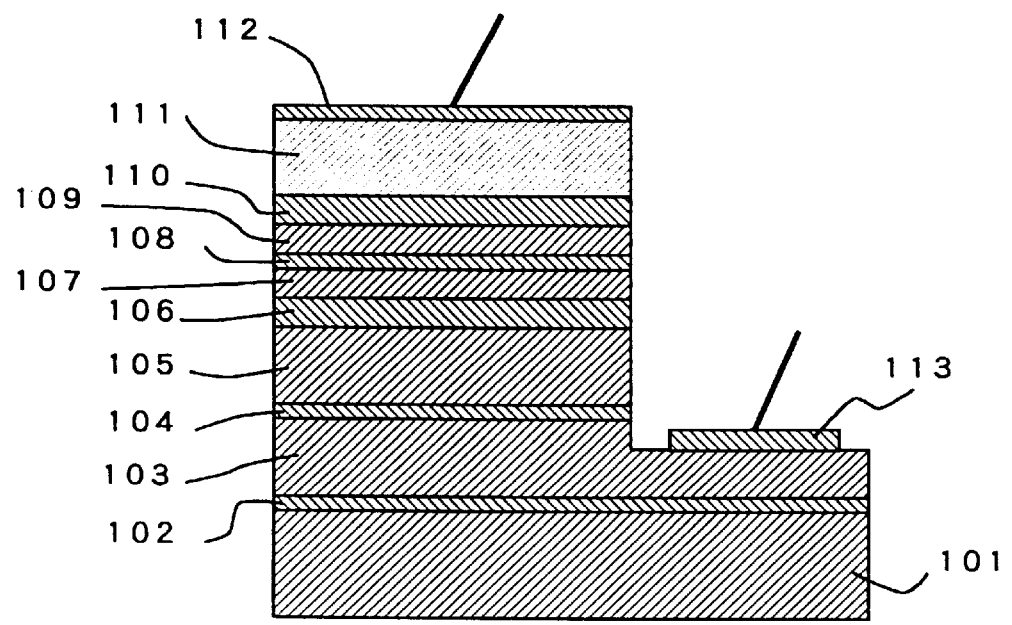
FIG. 2 is a sectional view showing an outlined structure of a gallium nitride laser device fabricated by a conventional method.

Next, with reference to the accompanying drawings, embodiments of the present invention will be described.

FIG. 1 is a sectional view showing an outlined structure of a gallium nitride laser device whose semiconductor layers are formed by the crystal growing method according to the present invention.

In FIG. 1, the gallium nitride laser device is fabricated by forming on a (11-20) surface of a sapphire substrate 101 the following layers.

102: 300 angstrom thick undoped gallium nitride low temperature growing buffer layer, 114: 0.1 $\mu$m thick undoped gallium nitride layer, 115: 0.3 $\mu$m thick magnesium-doped gallium nitride layer, 103: 3 $\mu$m thick silicon-doped n-type gallium nitride contact layer, 104: 0.1 $\mu$m thick silicon-doped n-type $In_{0.05}Ga_{0.95}N$ crack protecting layer, 105: 0.4 $\mu$m thick silicon-doped n-type $Al_{0.07}Ga_{0.93}N$ clad layer, 106: 0.1 $\mu$m thick silicon-doped n-type gallium nitride optical guide layer, 107: seventh period multiple quantum well structure activation layer, 108: 200 angstrom thick undoped AlGaN indium dissociation protecting layer, 109: 0.1 $\mu$m thick magnesium-doped p-type gallium nitride optical guide layer, 110: 0.4 $\mu$m thick magnesium-doped p-type $Al_{0.07}Ga_{0.93}N$ clad layer, 111: 0.2 $\mu$m thick magnesium-doped p-type gallium nitride contact layer, and 112: p-type electrode composed of nickel (first layer) and gold (second layer)

In addition, an n-type electrode 113 is formed on the contact layer 113. The n-type electrode 113 is composed of titanium (first layer) and aluminum (second layer).

The gallium nitride layer device is fabricated by forming a magnesium-doped gallium nitride 115 on the sapphire substrate 101 and forming a plurality of gallium nitride semiconductor layers including the multiple quantum well structure activation layer 107 thereon.

Among these layers, the undoped gallium nitride layer 114, the crack protecting layer 104, the dissociation protecting layer 108, and the optical guide layer 109 can be omitted.

The thickness of each layer is only an example. The optimum or preferable thickness of each layer can be easily obtained by simple tests.

FIGS. 3, 4, and 5 show half width at half maximum (FWHM) on X-ray rocking curves of an Mg-doped p-GaN layer, an undoped GaN layer, and an Si-doped n-GaN layer formed on a sapphire substrate.

FIG. 3 shows an X-ray rocking curve of a specimen of which a 200 angstrom thick GaN low temperature buffer layer, a 0.15 $\mu$m thick undoped GaN layer, and a 1.5 $\mu$m thick Mg-doped ($2 \times 10^{19}$ $cm^{-3}$) p-GaN layer are successively formed on a sapphire substrate by the conventional crystal-growing method. The curve shown in FIG. 3 represents that FWHM of the specimen is 370 seconds.

FIG. 4 shows an X-ray rocking curve of a specimen of which a 200 angstrom thick GaN low temperature buffer layer and a 1.5 $\mu$m thick undoped GaN layer are successively formed on a sapphire substrate by the conventional crystal growing method. The curve shown in FIG. 4 represents that FWHM is 413 seconds.

On the other hand, FIG. 5 shows an X-ray rocking curve of a specimen of which a 200 angstrom thick GaN low temperature buffer layer, a 0.15 $\mu$m thick undoped GaN layer, a 0.75 $\mu$m thick Mg-doped ($2 \times 10^{19}$ $cm^{-3}$) p-GaN layer, and a 0.75 $\mu$m thick Si-doped ($1 \times 10^{18}$ $cm^{-3}$) n-GaN layer are successively formed on a sapphire substrate by the crystal growing method according to the present invention. The curve shown in FIG. 5 represents that FWHM is 383 seconds.

Normally, FWHM of the Si-doped n-GaN layer is larger than FWHM of the undoped GaN layer. However, as shown in FIG. 5, FWHM of the Si-doped n-GaN layer formed on the Mg-doped p-GaN layer is smaller than FWHM of the undoped GaN layer shown in FIG. 4. Thus, FWHM of the Si-doped n-GaN layer formed on the Mg-doped p-GaN layer shown in FIG. 5 becomes similar to FWHM of the Mg-doped p-GaN layer shown in FIG. 3.

The magnesium-doped $Al_xGa_{1-x}N$ (where $0 \leq x \leq 1$) layer has better crystalline characteristics than the silicon-doped $Al_xGa_{1-x}N$ (where $0 \leq x \leq 1$) layer or the undoped $Al_xGa_{1-x}$ (where $0 \leq x \leq 1$) layer in FWHM on a rocking curve in a two-crystal X-ray diffraction evaluation. Thus, the magnesium-doped $Al_xGa_{1-x}N$ (where $0 \leq x \leq 1$) layer does not deteriorate the crystalline characteristics of each layer (including the multiple quantum well activation layer 107) formed thereon.

According to the embodiment of the present invention, an example of the magnesium-doped gallium nitride layer 115 is presented. However, the present invention is not limited to such an example. Instead, the gallium nitride layer 115 may be a magnesium-doped semiconductor layer expressed by general formula $Al_xGa_{1-x}$ (where $0 \leq x \leq 1$). In addition, a plurality of layers (including the activation layer) may be semiconductor layers expressed by general formula $In_xAl_yGa_{1-x-y}N$ (where $0 \leq x \leq 1$, $0 \leq y \leq 1$, $0 \leq x+y \leq 1$).

As the structure of the gallium nitride semiconductor light emitting device, a p-type layer, an activation layer, and an n-type layer may be formed on a substrate by the crystal growing method. However, when a sapphire substrate is used, a p-type electrode should be formed on a p-type layer exposed by dry-etching process. In this case, the front surface of the p-type layer is scratched by the dry-etching process. The scratched portion may be denatured to an n-type layer. In addition, since it is necessary to cause a current to flow in the p-type layer with high resistivity in the horizontal direction of the substrate, the device resistance becomes high. Thus, according to the embodiment of the present invention, the structure of which an n-type layer, an activation layer, and a p-type layer are successively formed on a magnesium-doped gallium nitride layer.

As described above, according to the present invention, a high quality gallium nitride semiconductor device can be fabricated. In the semiconductor device, the crystalline characteristics of the semiconductor layers including a light emitting layer are improved. In the case that the light emitting device according to the present invention is a laser device, it is expected that the oscillating threshold value of the laser device becomes low. In the case that the light emitting device according to the present invention is a light emitting diode, it can be expected that the light emitting efficiency of the light emitting diode becomes high.

Although the present invention has been shown and described with respect to a best mode embodiment thereof, it should be understood by those skilled in the art that the foregoing and various other changes, omissions, and additions in the form and detail thereof may be made therein without departing from the spirit and scope of the present invention.

What is claimed is:

1. A method of producing a gallium nitride semiconductor light emitting device, comprising:

(a) forming an undoped gallium nitride low temperature growing buffer layer on a substrate;

(b) forming a magnesium-doped gallium nitride layer expressed by general formula $Al_xGa_{1-x}N$, the magnesium-doped gallium nitride layer being formed over the undoped gallium nitride low temperature growing buffer layer;

(c) forming a contact layer expressed by general formula $In_xAl_yGa_{1-x-y}N$, the contact layer being formed over the magnesium-doped gallium nitride layer;

(d) forming a clad layer expressed by general formula $In_xAl_yGa_{1-x-y}N$, the clad layer being formed over the contact layer;

(e) forming an optical guide layer expressed by general formula $In_xAl_yGa_{1-x-y}N$, the optical guide layer being formed over the clad layer;

(f) forming an activation layer over the optical guide layer;

(g) forming a magnesium-doped p-type gallium nitride optical guide layer over the activation layer;

(h) forming a clad layer expressed by general formula $In_xAl_yGa_{1-x-y}N$, over the magnesium-doped p-type gallium nitride optical guide layer;

(i) forming a contact layer, expressed by general formula $In_xAl_yGa_{1-x-y}N$, over the clad layer which was formed over the magnesium-doped p-type gallium nitride optical guide layer; and (j) forming an electrode over the contact layer which was formed over the contact layer, the clad layer and the magnesium-doped p-type gallium nitride optical guide layer.

2. The method as set forth in claim 1, further comprising:
forming an undoped gallium nitride on the substrate before the step (b) is performed.

3. The method as set forth in claim 1, further comprising:
forming a magnesium-doped p-type gallium nitride optical guide layer on the substrate.

4. The method as set forth in claim 1, further comprising:
forming a silicon-doped n-type $In_{0.05}Ga_{0.95}N$ crack protecting layer on the substrate.

5. The method as set forth in claim 1, further comprising:
forming an undoped AlGaN indium dissociation protecting layer on the substrate.

* * * * *